(12) United States Patent
Kang et al.

(10) Patent No.: US 9,281,188 B2
(45) Date of Patent: Mar. 8, 2016

(54) APPARATUS AND METHOD FOR FABRICATING WAFER

(75) Inventors: Seok Min Kang, Seoul (KR); Moo Seong Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/235,354

(22) PCT Filed: Jul. 26, 2012

(86) PCT No.: PCT/KR2012/005967
§ 371 (c)(1),
(2), (4) Date: Jan. 27, 2014

(87) PCT Pub. No.: WO2013/015631
PCT Pub. Date: Jan. 31, 2013

(65) Prior Publication Data
US 2014/0170838 A1    Jun. 19, 2014

(30) Foreign Application Priority Data

Jul. 27, 2011   (KR) .......................... 10-2011-0074804

(51) Int. Cl.
| | | |
|---|---|---|
| H01L 21/20 | (2006.01) | |
| H01L 21/02 | (2006.01) | |
| C30B 33/02 | (2006.01) | |
| C30B 35/00 | (2006.01) | |
| C23C 16/54 | (2006.01) | |

(52) U.S. Cl.
CPC .......... *H01L 21/02656* (2013.01); *C30B 33/02* (2013.01); *C30B 35/00* (2013.01); *H01L 21/02529* (2013.01); *C23C 16/54* (2013.01); *H01L 21/0262* (2013.01)

(58) Field of Classification Search
CPC ....................................................... C23C 16/54

USPC .................................................. 438/907, 908
See application file for complete search history.

(56) References Cited

U.S. PATENT DOCUMENTS

| | | | | |
|---|---|---|---|---|
| 4,430,149 | A   * | 2/1984  | Berkman ......................... | 117/97 |
| 2003/0039766 | A1* | 2/2003  | Barnes et al. .................. | 427/569 |
| 2003/0104664 | A1* | 6/2003  | Kondo et al. .................. | 438/200 |
| 2006/0130742 | A1  | 6/2006  | Carter et al. | |
| 2007/0274810 | A1* | 11/2007 | Holtkamp et al. ............ | 414/217 |
| 2008/0173974 | A1* | 7/2008  | Van Noort et al. ............ | 257/528 |
| 2011/0220025 | A1* | 9/2011  | Jeong et al. .................... | 118/719 |

FOREIGN PATENT DOCUMENTS

| | | |
|---|---|---|
| KR | 10-2005-0013113 | 2/2005 |
| KR | 10-2009-0066973 | 6/2009 |
| KR | 10-2010-0108872 | 10/2010 |

OTHER PUBLICATIONS

International Search Report in International Application No. PCT/KR2012/005967, filed Jul. 26, 2012.

* cited by examiner

*Primary Examiner* — Angel Roman
(74) *Attorney, Agent, or Firm* — Saliwanchik, Lloyd & Eisenschenk

(57) ABSTRACT

A method for fabricating a wafer according to the embodiment comprises the steps of depositing an epi layer in an epi deposition part; transferring the wafer to an annealing part connected to the epi deposition part; annealing the wafer in the annealing part; transferring the wafer to a cooling part connected to the annealing part; and cooling the wafer in the cooling part, wherein the depositing of the wafer, the annealing of the wafer and the cooling of the wafer are continuously performed. An apparatus for fabricating a wafer according to the embodiment comprises an epi deposition part; an annealing part connected to the epi deposition part; and a cooling part connected to the annealing part.

5 Claims, 2 Drawing Sheets

APPARATUS AND METHOD FOR FABRICATING WAFER

CROSS-REFERENCE TO RELATED APPLICATIONS

This application is the U.S. national stage application of International Patent Application No. PCT/KR2012/005967, filed Jul. 26, 2012, which claims priority to Korean Application No. 10-2011-0074804, filed Jul. 27, 2011, the disclosures of each of which are incorporated herein by reference in their entirety.

TECHNICAL FIELD

The disclosure relates to an apparatus and a method for fabricating a wafer.

BACKGROUND ART

In general, materials are very important factors to determine the property and the performance of final products in the electric, electronic and mechanical industrial fields.

Since silicon (Si) used as a representative semiconductor device material is weak at the temperature of 100° C. or above, a semiconductor device may erroneously operate or may be failed frequently, so the semiconductor device requires various cooling apparatuses. As silicon (Si) has the physical limitation, wideband semiconductor materials such as SiC, GaN, AlN, and ZnO have been spotlighted as next-generation semiconductor device materials.

When comparing with GaN, AlN and ZnO, SiC represents the superior thermal stability and superior oxidation-resistance property. In addition, the SiC has the superior thermal conductivity of about 4.6 W/Cm° C., so the SiC can be used for fabricating a large-size substrate having a diameter of about 2 inches or above. In particular, a silicon carbide epi wafer having a high quality, which is heavily doped at a low concentration, can be used in the field of high-power devices.

According to the related art, in order to grow the silicon carbide epi layer on a wafer, the silicon carbide is deposited on the wafer in a chamber and an annealing process and/or a cooling process is performed to provide an epi wafer on which the silicon carbide epi layer has been grown.

That is, according to the related art, a silicon carbide wafer has been introduced into a single or batch-type reaction chamber and a layer has been deposited on the silicon carbide wafer. Then, in general, the wafer has been introduced into an annealing apparatus and/or a cooling apparatus and processes for removing defects on the surface of the wafer have been continuously performed, such that a silicon carbide epi wafer has been manufactured.

However, in the above process, it takes so much time to heat or cool the hot zone through induction heating. That is, the temperature in the chamber must be increased to a predetermined temperature in order to grow the epi layer in the chamber. At this time, there is a need for the step of cooling the chamber again after the chamber is heated to the predetermined temperature and the epi layer is deposited.

However, so much time is needed to heat or cool the hot zone area in the chamber. As one example, since it takes two hours or more to heat or cool the hot zone area, the time for the entire process is increased, so that the problem is caused that the product yield of the wafers is reduced.

Therefore, there is a need to omit the repetitive process for heating or cooling the chamber in growing of the silicon carbide epi layer and to provide a process for continuously fabricating the silicon carbide epi wafer. That is, there is a need to provide a process for fabricating the silicon carbide epi wafer by continuously performing the depositing, annealing and cooling processes.

DISCLOSURE OF INVENTION

Technical Problem

The embodiment provides an apparatus and a method for fabricating a wafer, which can reduce the process time for fabricating the wafer.

Solution to Problem

A method for fabricating a wafer according to the embodiment comprises the steps of depositing an epi layer on a wafer in an epi deposition part; transferring the wafer to an annealing part connected to the epi deposition part; annealing the wafer in the annealing part; transferring the wafer to a cooling part connected to the annealing part; and cooling the wafer in the cooling part, wherein the depositing of the wafer, the annealing of the wafer and the cooling of the wafer are continuously performed.

Further, a method for fabricating a wafer according to the embodiment comprises the steps of depositing an epi layer on a wafer in an epi deposition part; transferring the wafer to a cooling part connected to the epi deposition part; and cooling the wafer in the cooling part, wherein the depositing of the wafer and the cooling of the wafer are continuously performed.

An apparatus for fabricating a wafer according to the embodiment comprises an epi deposition part; an annealing part connected to the epi deposition part; a cooling part connected to the annealing part; and a wafer transfer apparatus connected to lower portions of the epi deposition part, the annealing part and the cooling part.

Further, an apparatus for fabricating a wafer according to the embodiment comprises an epi deposition part; a cooling part connected to the epi deposition part; and a wafer transfer apparatus connected to lower portions of the epi deposition part and the cooling part.

Advantageous Effects of Invention

According to the method for fabricating the wafer of the embodiment, the epi layer depositing step, the annealing step and the cooling step may be continuously performed at one time. Thus, since there is no need for cooling or heating the hot zone in the chamber of the epi deposition part, the process time required to heat or cool the chamber for forming the hot zone in the chamber may be shortened.

That is, since the method for fabricating the wafer according to the embodiment may continuously perform the epi layer depositing step, the annealing step and the cooling step at one time, it is possible to continuously fabricate the wafer, and since the heating and cooling processes of the epi deposition part may be omitted, the fabricating time for the wafer may be shortened, so that the wafer may be fabricated with higher efficiency.

MODE FOR THE INVENTION

Figure 1:
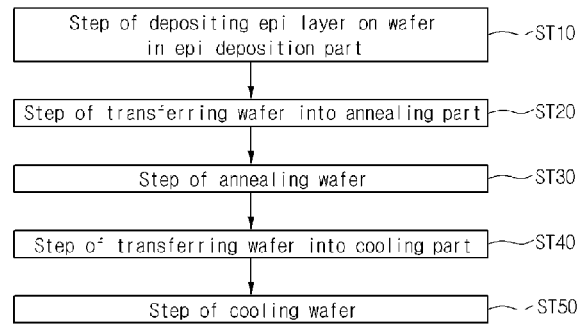
FIG. 1 is a flowchart illustrating a method for fabricating a wafer according to an embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer (or film), each region, each pattern, or each structure shown in the drawings may be exaggerated, omitted or schematically drawn for the purpose of convenience or clarity. In addition, the size of each layer (or film), each region, each pattern, or each structure does not utterly reflect an actual size.

Hereinafter, the embodiments will be described in detail with reference to accompanying drawings.

Figure 2:
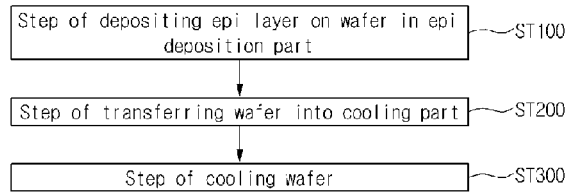
FIG. 2 is a flowchart illustrating a method for fabricating a wafer according to a modified embodiment.

A method for fabricating a wafer according to the embodiment will be described in detail with reference to FIGS. 1 and 2. FIG. 1 is a flowchart showing the method for fabricating the wafer according to the embodiment. FIG. 2 is a flowchart showing a method for fabricating a wafer according to a modified embodiment.

Referring to FIG. 1, the method for fabricating the epi wafer according to the embodiment may comprise a step ST10 of depositing an epi layer on a wafer in an epi deposition part; a step ST20 of transferring the wafer to an annealing part connected to the epi deposition part; a step ST30 of annealing the wafer; a step ST40 of transferring the wafer to a cooling part connected to the annealing part; and a step ST50 of cooling the wafer in the cooling part, wherein the depositing, annealing and cooling steps ST10, step ST30 and ST50 are continuously performed.

Further, as the modified embodiment, the method for fabricating the epi wafer comprises a step ST100 of depositing an epi layer on a wafer in an epi deposition part; a step ST200 of transferring the wafer to a cooling part connected to the epi deposition part; and a step ST300 of cooling the wafer in the cooling part, wherein the depositing and cooling steps are continuously performed.

Hereinafter, the method for fabricating the wafer will be described with reference to FIG. 1.

In the step ST10 of depositing the epi layer, the epi layer may be grown on a surface of the wafer. The forming of the epi layer is to grow a single crystal layer, a material of which is the same as or different from that of the single crystal wafer, on a single crystal wafer.

Conventionally, the epi layer may be formed through a chemical vapor deposition (CVD) process. Specifically, the CVD process may comprise thermal CVD, plasma enhanced CVD, low pressure CVD, metal organic CVD, and atomic layer deposition processes. The processes may be suitably selected according to characteristics of a target layer In the case of the CVD process, reaction gas, such as source gas, carrier gas or pressure adjusting gas, is supplied onto the wafer placed in a vacuum chamber and the epi layer is formed on the wafer through the surface reaction between the reaction gas and the wafer. For example, the epitaxial layer may be formed by depositing silane ($SiH_4$) or DSC (dichlorosilane, $SiH_2$) gas on the wafer surface in a CVD equipment using $H_2$ and Ar gas as carriers.

The step ST10 of depositing the epi layer on the wafer is as follows.

First, the wafer is transferred from a wafer cartridge into the epi deposition part 100.

Then, the wafer is transferred into a hot zone, which is the center of a heat generation induction part in the epi deposition part 100, by a wafer transfer apparatus 600. For example, the heat generation induction part may be a high-frequency induction coil. The wafer may be heated as a high-frequency current flows through the high frequency induction coil, such that the temperature of the wafer may be increased to an epi layer growth temperature. Then, the epi layer is grown on the wafer through a surface reaction between the reaction gas and the wafer by the induction heating. As one example, the epi layer may be a silicon carbide epi layer.

In the step ST10 of growing the epi layer, the epi layer may be grown at a constant growth temperature TG in the first chamber 100. For example, the growth temperature TG may be in the range of about 1300° C. to about 1700° C.

Then, in the step ST20 of transferring the wafer into the annealing part 200 connected to the epi deposition part 100, the wafer is transferred into the annealing part 200 connected to the epi deposition part 100 after the epi layer has been grown on the wafer.

A passage between the epi deposition part 100 and the annealing part 200 is blocked by a first blocking member 400. The first blocking member 400 may be open when the epi layer is grown on the wafer, so that the wafer, on which the epi layer has been grown, is transferred into the annealing part 200.

When the first blocking member 400 is open, the reaction gas may permeate from the epi deposition part 100 into the annealing part 200. When the wafer is transferred into the annealing part 200, the supply of the reaction gas from the epi deposition part 100 to the annealing part 200 is cut off and inert gas is provided, so that contamination is prevented.

Then, in the step ST30 of annealing the wafer, the wafer, on which the epi layer has been grown, may be annealed. That is, the wafer, on which the epi layer has been grown, may be heat-treated at the constant temperature.

The annealing step ST30 may be performed at the higher temperature TA than the growth temperature TG. In detail, the annealing temperature TA may be higher than the growth temperature TG by about 100° C. to about 200° C. At this time, the annealing step ST30 may be performed for about 1 hour.

The annealing step ST30 may be performed in high vacuum.

A mismatch caused by a thermal expansion of the wafer and the epi layer, may be restrained through the annealing step ST30.

In the step ST40 of transferring the wafer into the cooling part 300 connected to the annealing part 200, the wafer, which has been annealed, is transferred into the cooling part 300 connected to the annealing part 200.

A passage between the annealing part 200 and the cooling part 300 is blocked by a second blocking member 500. The second blocking member 500 may be open when the wafer is annealed, so that the wafer, which has been annealed, is transferred into the cooling part 300.

Then, in the step ST50 of cooling the wafer, the wafer, on which the epi layer has been grown, may be cooled. In the cooling step ST50, the epi layer may be stable on the wafer by falling down the annealing temperature TA.

The wafer may be transferred by a wafer transfer apparatus 600.

For example, the wafer transfer apparatus may use a conveyor belt. The conveyor belt may be formed of a material having the endurance against the high temperature. Preferably, the conveyor belt may be formed of a material comprising ceramic which endures the growth temperature in the range of about 1300° C. to about 1700° C. or may be coated with the material comprising ceramic. The wafer may be sequentially transferred into the epi deposition part 100, the annealing part 200 and the cooling part 300 through the conveyor belt.

However, the embodiment is not limited to the above, and the wafer can be directly transferred into the cooling part 300 without the annealing step ST30, such that the wafer may be cooled in the cooling part 300. Referring to FIG. 2, the method for fabricating the wafer according to the modified embodiment comprises the step ST100 of depositing the epi layer on the wafer in the epi deposition part; the step ST200 of transferring the wafer into the cooling part connected to the epi deposition part; and the step ST300 of cooling the wafer in the cooling part, wherein the depositing and cooling steps are continuously performed.

That is, the epi deposition part 100 is connected to the cooling part 300. In addition, if the deposition of the epi layer on the wafer is completed in the epi deposition part 100, the first blocking member 400, which is placed at a connecting portion between the epi deposition part 100 and the cooling part 300, is open, such that the wafer is transferred to the cooling part 300 and is cooled.

In the related art, the epi wafer has been generally fabricated in the form of a bath through the epitaxial growth. However, since the wafer is heated to the growth temperature of the epi layer in the epi deposition part 100 and it takes a very long time to cool the wafer, the process time may be increased. As one example, since it takes about 2 hours to heat the wafer to the growth temperature and cool the heated wafer and the heating and cooling must be repeatedly performed, a very long time has been spent.

However, the method for fabricating the wafer according to the embodiment may omit a repeat performance of the heating and cooling steps. That is, since the epi deposition, annealing and cooling processes can be sequentially performed at one time, the repeat performance of the steps of heating the wafer to the growth temperature and cooling the wafer may be removed, so that the working process may be simplified. Thus, the product yield of the wafers may be improved.

Figure 3:
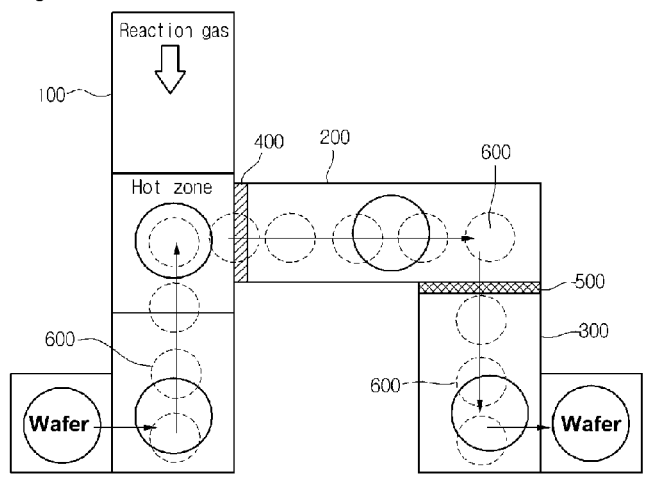
FIG. 3 is a schematic view of an apparatus for fabricating a wafer according to the embodiment.
Figure 4:
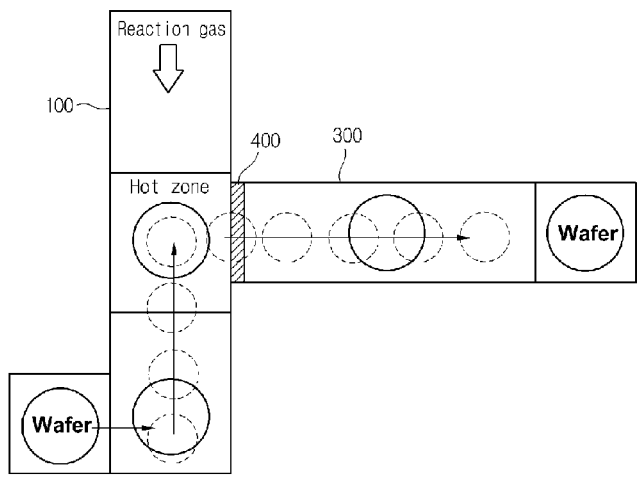
FIG. 4 is a schematic view of an apparatus for fabricating a wafer according to a modified embodiment.
Figure 5:
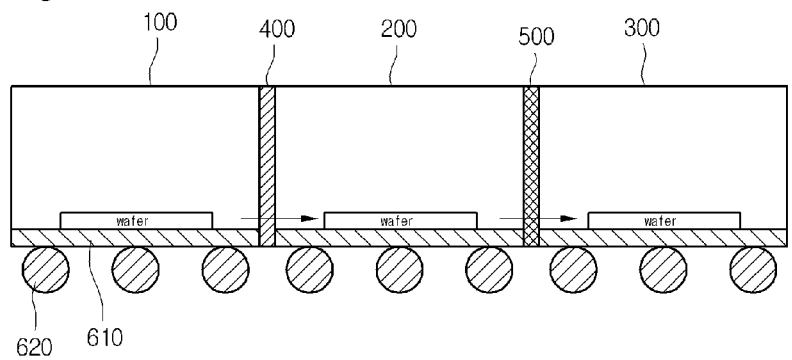
FIG. 5 is a plan view of the apparatus for fabricating the wafer according to the embodiment.
Figure 6:
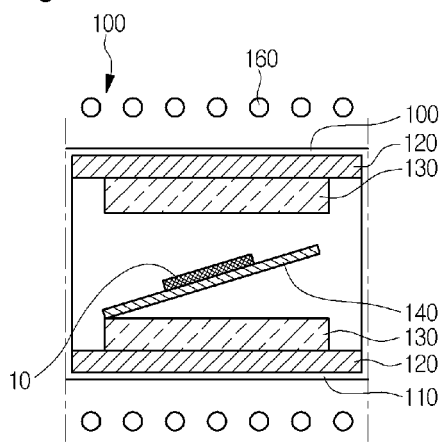
FIG. 6 is an enlarged view showing an epi deposition part of the apparatus for fabricating the wafer according to the embodiment.

Hereinafter, the apparatus for fabricating the wafer according to the embodiment will be described in detail with reference to FIGS. 3 to 6. FIGS. 3 and 4 are schematic views of the apparatus for fabricating the wafer according to the embodiment. FIG. 5 is a plan view of the apparatus for fabricating the wafer according to the embodiment. FIG. 6 is an enlarged view showing the epi deposition part.

Referring to FIGS. 3 to 5, the apparatus for fabricating the wafer according to the embodiment may comprise an epi deposition part 100; an annealing part 200 connected to the epi deposition part 100; a cooling part 300 connected to the annealing part 200; and a wafer transfer apparatus connected to lower portions of the epi deposition part 100, the annealing part 200 and the cooling part 300.

Further, the apparatus for fabricating the wafer according to the modified embodiment may comprise an epi deposition part 100; a cooling part 300 connected to the epi deposition part 100; and a wafer transfer apparatus 600 connected to lower portions of the epi deposition part 100 and the cooling part 300.

An epi layer may be grown on the wafer in the epi deposition part 100. As one example, the epi deposition part 100 may grow the epi layer on the wafer through a chemical vapor deposition process.

Referring to FIG. 6, the epi deposition part 100 may comprise a chamber 110, a heat generation device 160, a thermal insulation unit 120, a susceptor 130, and a wafer holder 140 which is comprised in the susceptor 130.

The epi deposition part 100 may be heated to the growth temperature by the heat generation device 160 comprising a filament or a coil, and may form the epi layer on the wafer using a reaction between reaction gas and a surface of the wafer in the chamber 100.

The annealing part 200 is connected to the epi deposition part 100. The epi deposition part 100 and the annealing part 200 may be joined to each other by mechanically combining and welding the chambers of the epi deposition part 100 and the annealing part 200. A first blocking member 400 may be placed at a connecting portion between the epi deposition part 100 and the annealing part 200. After the epi growth is completed on the wafer in the epi deposition part 100, when the wafer is transferred into the annealing part 200, the first blocking member 400 may be open.

The wafer, on which the epi layer is grown, may be annealed in the annealing part 200. That is, the wafer, on which the epi layer is grown, may be heat-treated at constant temperature. The annealing may be implemented at temperature TA by a heating member, which is equal to or higher than the growth temperature TG, in the chamber under the vacuum condition.

The cooling part 300 is connected to the annealing part 200. The annealing part 200 and the cooling part 300 may be joined to each other by mechanically combining and welding the chambers of the annealing part 200 and the cooling part 300. A second blocking member 500 may be placed at a connecting portion between the annealing part 200 and the cooling part 300. After the heat-treatment process is completed for the wafer in the annealing part 200, when the wafer is transferred into the cooling part 300, the second blocking member 500 may be open.

The wafer transfer apparatus may be connected to the low portions of the epi deposition part 100, the annealing part 200 and the cooling part 300. The wafer transfer apparatus 600 may transfer the wafer for a next process after carrying out each process. For example, the wafer transfer apparatus 600 may comprise a conveyor belt which may be made of a ceramic type of a material endurable at a high-temperature. Further, the wafer transfer apparatus 600 may comprise a rotatable roller 620 and a strip 610 on the roller 620.

The apparatus for fabricating the wafer may transfer the wafer into the epi deposition part 100, the annealing part 200 and the cooling part 300 for each process through the wafer transfer apparatus, fabricating the wafer sequentially and consistently. Therefore, compared with the wafer fabricated in the bath type according to the related art, the heating and cooling time by the epi deposition part 100 may be greatly reduced. Thus, the fabricating efficiency of the wafer may be improved and its process time may be shortened.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method for fabricating a wafer, the method comprising:
   depositing an epi layer on a wafer in an epi deposition part;
   transferring the wafer to an annealing part connected to the epi deposition part;
   annealing the wafer in the annealing part;
   transferring the wafer to a cooling part connected to the annealing part; and
   cooling the wafer in the cooling part;
   wherein the depositing of the wafer, the annealing of the wafer, and the cooling of the wafer are continuously performed;
   wherein a passage between the epi disposition part and the annealing part is blocked by a first blocking member,
   wherein a passage between the annealing part and the cooling part is blocked by a second blocking member,
   wherein the epi layer is a silicon carbide epi layer,
   wherein a growth temperature of the epi deposition part is in a range of from about 1300° C. to about 1700° C.,
   wherein the epi deposition part deposits a silicon carbide epi layer,
   wherein the wafer is transferred by a wafer transfer apparatus, and
   wherein the wafer transfer apparatus is formed of a material that endures the growth temperature of the range of from about 1300° C. to about 1700° C.

2. A method for fabricating a wafer, the method comprising:
   depositing an epi layer on a wafer in an epi deposition part;
   transferring the wafer to a cooling part connected to the epi deposition part; and
   cooling the wafer in the cooling part;
   wherein the depositing of the wafer and the cooling of the wafer are continuously performed,
   wherein a passage between the epi deposition part and the cooling part is blocked by a blocking member,
   wherein the epi layer is a silicon carbide epi layer,
   wherein a growth temperature of the epi deposition part is in a range of from about 1300° C. to about 1700° C.,
   wherein the wafer is transferred by a wafer transfer apparatus, and
   wherein the wafer transfer apparatus is formed of a material that endures the growth temperature of the range of from about 1300° C. to about 1700° C.

3. An apparatus for fabricating a wafer, the apparatus comprising:
   an epi deposition part;
   an annealing part connected to the epi deposition part;
   a cooling part connected to the annealing part;
   a first blocking member between the epi deposition part and the annealing part;
   a second blocking member between the annealing part and the cooling part; and
   a wafer transfer apparatus connected to lower portions of the epi deposition part, the annealing part, and the cooling part;
   wherein the epi deposition part deposits a silicon carbide epi layer,
   wherein the wafer is transferred by a wafer transfer apparatus,
   wherein the wafer transfer apparatus is formed of a material that endures a growth temperature in a range of from about 1300° C. to about 1700° C.

4. An apparatus for fabricating a wafer, the apparatus comprising:
   an epi deposition part;
   a cooling part connected to the epi deposition part;
   a blocking member between the epi deposition part and the cooling part;
   a wafer transfer apparatus connected to lower portions of the epi deposition part and the cooling part; and
   wherein the epi deposition part deposits a silicon carbide epi layer.

5. The method of claim 4, wherein the annealing of the wafer is performed at a temperature higher than a deposition temperature by about 100° C. to about 200° C.

* * * * *